United States Patent
Kulgevich

(10) Patent No.: US 12,360,579 B2
(45) Date of Patent: Jul. 15, 2025

(54) RECOVERY OF DIELECTRIC FLUID FOR IMMERSION COOLING SYSTEM

(71) Applicant: Google LLC, Mountain View, CA (US)

(72) Inventor: Michael Kulgevich, Morgan Hill, CA (US)

(73) Assignee: Google LLC, Mountain View, CA (US)

(*) Notice: Subject to any disclaimer, the term of this patent is extended or adjusted under 35 U.S.C. 154(b) by 323 days.

(21) Appl. No.: 18/104,587

(22) Filed: Feb. 1, 2023

(65) Prior Publication Data

US 2023/0259182 A1 Aug. 17, 2023

Related U.S. Application Data

(60) Provisional application No. 63/310,803, filed on Feb. 16, 2022.

(51) Int. Cl.
*G06F 1/20* (2006.01)

(52) U.S. Cl.
CPC .......... *G06F 1/20* (2013.01); *G06F 2200/201* (2013.01)

(58) Field of Classification Search
CPC .......... H05K 7/20236; H05K 7/20272; H05K 7/203; H05K 7/20309; H05K 7/20318; H05K 7/20736; H05K 7/20772; H05K 7/20781; H05K 7/208; H05K 7/209; H05K 7/20818; H05K 7/20836; H05K 5/00; H05K 5/0221; H05K 5/061; H05K 5/067; H01L 23/44; H01L 23/473; H01L 2225/06589; G06F 1/20; G06F 1/206; G06F 1/181; G06F 2200/201; F28F 13/00; B25J 11/008; B25J 15/0028; B25J 18/002

See application file for complete search history.

(56) References Cited

U.S. PATENT DOCUMENTS

| | | | |
|---|---|---|---|
| 6,231,684 B1* | 5/2001 | Mouser | B08B 3/12 134/30 |
| 8,756,826 B2 | 6/2014 | Gibbel | |
| 9,655,279 B2 | 5/2017 | Pelletier et al. | |
| 10,123,453 B2 | 11/2018 | Saito | |
| 10,306,799 B2 | 5/2019 | Saito | |
| 10,401,924 B2 | 9/2019 | Saito | |
| 10,477,726 B1 | 11/2019 | Enright et al. | |
| 10,481,650 B2 | 11/2019 | Saito | |

(Continued)

FOREIGN PATENT DOCUMENTS

| | | |
|---|---|---|
| CN | 2589903 Y | 12/2003 |
| CN | 103056874 B | 5/2015 |

(Continued)

OTHER PUBLICATIONS

Office Action for European Patent Application No. 23156730.6 dated Aug. 29, 2024. 10 pages.

(Continued)

*Primary Examiner* — Amir A Jalali

(74) *Attorney, Agent, or Firm* — Lerner David LLP

(57) ABSTRACT

A fluid recovery system for an immersion cooling unit includes a transfer chamber. The transfer chamber encloses a transfer space and includes two openings into the transfer space and two doors operable to selectively open or close the openings. The system also includes a gantry and an arm supported by the gantry. The arm is movable by the gantry through the first opening.

18 Claims, 6 Drawing Sheets

(56) References Cited

U.S. PATENT DOCUMENTS

| | | |
|---|---|---|
| 10,645,841 B1 | 5/2020 | Mao et al. |
| 10,750,637 B1* | 8/2020 | Alissa ................. H05K 7/20781 |
| 10,791,647 B1 | 9/2020 | Miyamura et al. |
| 11,134,586 B2* | 9/2021 | Enright .............. H05K 7/20327 |
| 11,160,194 B2 | 10/2021 | Lau |
| 11,304,340 B2* | 4/2022 | Chen .................. H05K 7/20272 |
| 12,049,239 B2* | 7/2024 | Mertel .............. B60W 60/0025 |
| 2013/0028692 A1* | 1/2013 | Lin .......................... B25J 9/023 |
| | | 414/589 |
| 2014/0301037 A1 | 10/2014 | Best |
| 2016/0265846 A1 | 9/2016 | Tice |
| 2018/0303008 A1 | 10/2018 | Shen |
| 2019/0208664 A1 | 7/2019 | Saito |
| 2020/0089293 A1 | 3/2020 | Enright et al. |
| 2020/0093024 A1 | 3/2020 | Enright et al. |
| 2020/0093025 A1 | 3/2020 | Enright et al. |
| 2020/0093026 A1* | 3/2020 | Enright ................... B25J 9/026 |
| 2020/0093037 A1 | 3/2020 | Enright et al. |
| 2020/0093038 A1 | 3/2020 | Enright et al. |
| 2021/0144885 A1 | 5/2021 | Enright et al. |
| 2021/0153386 A1* | 5/2021 | Lau ....................... B66C 19/005 |
| 2022/0312641 A1* | 9/2022 | Wu .................... H05K 7/20136 |

FOREIGN PATENT DOCUMENTS

| | | |
|---|---|---|
| CN | 105353848 A | 2/2016 |
| CN | 107120915 A | 9/2017 |
| CN | 108882652 A | 11/2018 |
| CN | 108901187 A | 11/2018 |
| CN | 104991623 B | 2/2019 |
| CN | 109618538 A | 4/2019 |
| CN | 109618538 B | 10/2020 |
| CN | 110753474 B | 9/2021 |
| EP | 2589903 A1 | 5/2013 |
| EP | 3726945 A1 | 10/2020 |
| KR | 101492559 B1 | 2/2015 |
| KR | 20220005450 A | 1/2022 |
| WO | 2013063705 A1 | 5/2013 |

OTHER PUBLICATIONS

Extended European Search Report for European Patent Application No. 23156730.6 dated Jun. 23, 2023. 12 pages.

Office Action for European Patent Application No. 23156730.6 dated Apr. 28, 2025. 13 pages.

* cited by examiner

RECOVERY OF DIELECTRIC FLUID FOR IMMERSION COOLING SYSTEM

CROSS-REFERENCE TO RELATED APPLICATION

This application claims the benefit of the filing date of the U.S. Provisional Patent Application No. 63/310,803 filed Feb. 16, 2022, which is incorporated by reference in its entirety.

BACKGROUND

Information technology ("IT") or computing equipment generates heat during operation and tends to operate better and fail at lower rates when cooled. For this reason, cooling systems for computing equipment have been developed. One type of cooling system is an immersion cooling system having a tank of evaporable liquid and a condenser, the condenser typically being located above evaporable dielectric fluid, for extracting heat from and condensing vapor that rises from the tank. The tank and the condenser are contained in a housing to retain the vapor.

Immersion cooling systems of this kind can lose dielectric fluid over time, particularly when computing hardware components are installed in or taken from the tank. Transferring hardware into or out of the system requires opening the housing of the tank, which allows dielectric fluid to escape as vapor. Dielectric fluid in the liquid state may also cling to hardware that is removed from the tank. Loss of dielectric fluid this way creates a need to periodically add more dielectric fluid to the cooling system to maintain acceptable fluid levels.

Adding or removing hardware can also be time consuming Temperatures inside immersion cooling systems can be too high for unprotected access. Before opening the housing, personnel may therefore need to stop the operation of the hardware in the system to allow the system to cool down, wear protective equipment, or both. These precautions are particularly disruptive for cooling systems installed in environments where protective equipment is usually unnecessary, such as typical datacenters.

Cost and operating efficiency for immersion cooling systems could be improved by reducing fluid loss and downtime associated with adding or removing hardware.

BRIEF SUMMARY

Aspects of this disclosure are directed to an immersion cooling unit that may be provided with a gantry supporting an arm for grasping, lifting, and transporting hardware within the unit. The arm may be, for example, a robot arm or a crane. The arm may be used to drip-dry or spin-dry the hardware before the hardware leaves the unit. The gantry and arm are configured to place hardware into the immersion tank of the immersion cooling unit and to lift hardware out of the immersion tank.

In some arrangements, the unit may also be provided with a transfer chamber having a first door that opens toward an interior of the immersion cooling unit and a second door that is accessible from outside of the immersion cooling unit. The transfer chamber may extend through a wall or partition that separates the internal space of the immersion cooling unit from ambient air outside of the unit. The first and second doors may be capable of opening and closing independently from one another. Either or both of the doors may be fitted with a seal to prevent air from escaping around the edges of the door when the door is closed. Closing both doors may therefore hermetically seal a space enclosed by the transfer chamber, except for any ventilation features provided in the transfer chamber for recovering vapor from the transfer chamber. By opening only one door at a time, it may be possible to pass hardware into or out of the unit through the transfer chamber without the cooling unit's internal atmosphere ever being in direct communication with the ambient air outside of the unit. The transfer chamber may be provided with an air pump or one or more fans, such as an exhaust fan fitted to the first door, to remove dielectric vapor from the transfer chamber between closing the first door and opening the second door. Dielectric vapor may be removed by evacuating the transfer chamber entirely or by blowing air with little or no dielectric vapor through the chamber to displace the vapor. Air removed from the chamber may be sent directly into the unit's interior or may be directed through a passive or active condenser arranged to collect the dielectric fluid condensed from the vapor.

In another aspect, a fluid recovery system for an immersion cooling unit may comprise a transfer chamber. The transfer chamber may enclose a transfer space. The transfer chamber may include a first opening into the transfer space, a second opening into the transfer space, a first door operable to selectively open or close the first opening, and a second door operable to selectively open or close the second opening. The system may also include a gantry and an arm supported by the gantry. The arm may be movable by the gantry through the first opening.

In some arrangements according to any of the foregoing, the doors may be opened and closed independently from one another.

In some arrangements according to any of the foregoing, the system may include a conveyor within the transfer chamber configured to transport computer hardware between at least two different locations within the transfer chamber.

In some arrangements according to any of the foregoing, the conveyor may be any one or any combination of a conveyor belt, a platform connected to a linear actuator, and an arrangement of multiple linear actuators.

In some arrangements according to any of the foregoing, the system may comprise a fan or air pump configured to displace air from the transfer chamber when both doors are closed.

In some arrangements according to any of the foregoing, the system may comprise a condenser, and the fan or air pump may be configured to direct the displaced air through the condenser.

In some arrangements according to any of the foregoing, the first door may include an exhaust opening and an exhaust fan arranged to draw air out of the transfer chamber through the exhaust opening when the first door is closed.

In some arrangements according to any of the foregoing, the arm or the gantry may include a motor configured to spin the arm.

In some arrangements according to any of the foregoing, the system may comprise a partition separating a first space from a second space, wherein the gantry is at least partially located in the first space, the first opening is between the first space and the transfer space, and the second opening is between the second space and the transfer space.

In some arrangements according to any of the foregoing, an immersion cooling unit for computer hardware may comprise an enclosure and the fluid recovery system of any of the above examples, and the partition of the fluid recovery system may be part of the enclosure.

In some arrangements according to any of the foregoing, the partition may be configured to hermetically seal an internal space of a separate immersion cooling unit.

In some arrangements according to any of the foregoing, the module may comprise a set of wheels mounted to the partition.

In some arrangements according to any of the foregoing, an immersion cooling array may comprise a plurality of immersion cooling units each of which includes a tank for storing dielectric liquid and the immersion cooling module of any of the above examples. The array may also comprise a rail for conveying the immersion cooling module among the immersion cooling units.

In another aspect, a method of conveying a computer hardware component into or out of an immersion cooling unit may comprise passing the component through a first opening of a transfer chamber while a second opening of the transfer chamber is closed. The method may also comprise passing the component through the second opening while the first opening is closed. The first opening may be between a transfer space enclosed by the transfer chamber and an internal space enclosed by the immersion cooling unit and within which a cooling tank is located. The second opening may be between the transfer space and an ambient space outside of the immersion cooling unit.

In some arrangements according to any of the foregoing, passing the component through the first opening may be accomplished with a mechanical arm that is movably connected to a gantry located within the internal space.

In some arrangements according to any of the foregoing, the method may comprise carrying the component between the first opening and an operating position in the tank with the mechanical arm and the gantry.

In some arrangements according to any of the foregoing, the method may comprise spinning the component with the mechanical arm after lifting the component out of the operating position and a liquid in the tank.

In some arrangements according to any of the foregoing, the method may comprise continuing to run the immersion cooling unit and other computer hardware cooled in the tank throughout passing the component through the first and second openings and carrying the component between the first opening and the operating position.

In some arrangements according to any of the foregoing, the method may comprise moving the component between two positions within the transfer space with a mechanical conveyor.

In some arrangements according to any of the foregoing, the method may comprise displacing air from the transfer space while both openings are closed and the component is in the transfer chamber.

DETAILED DESCRIPTION

Figure 1:
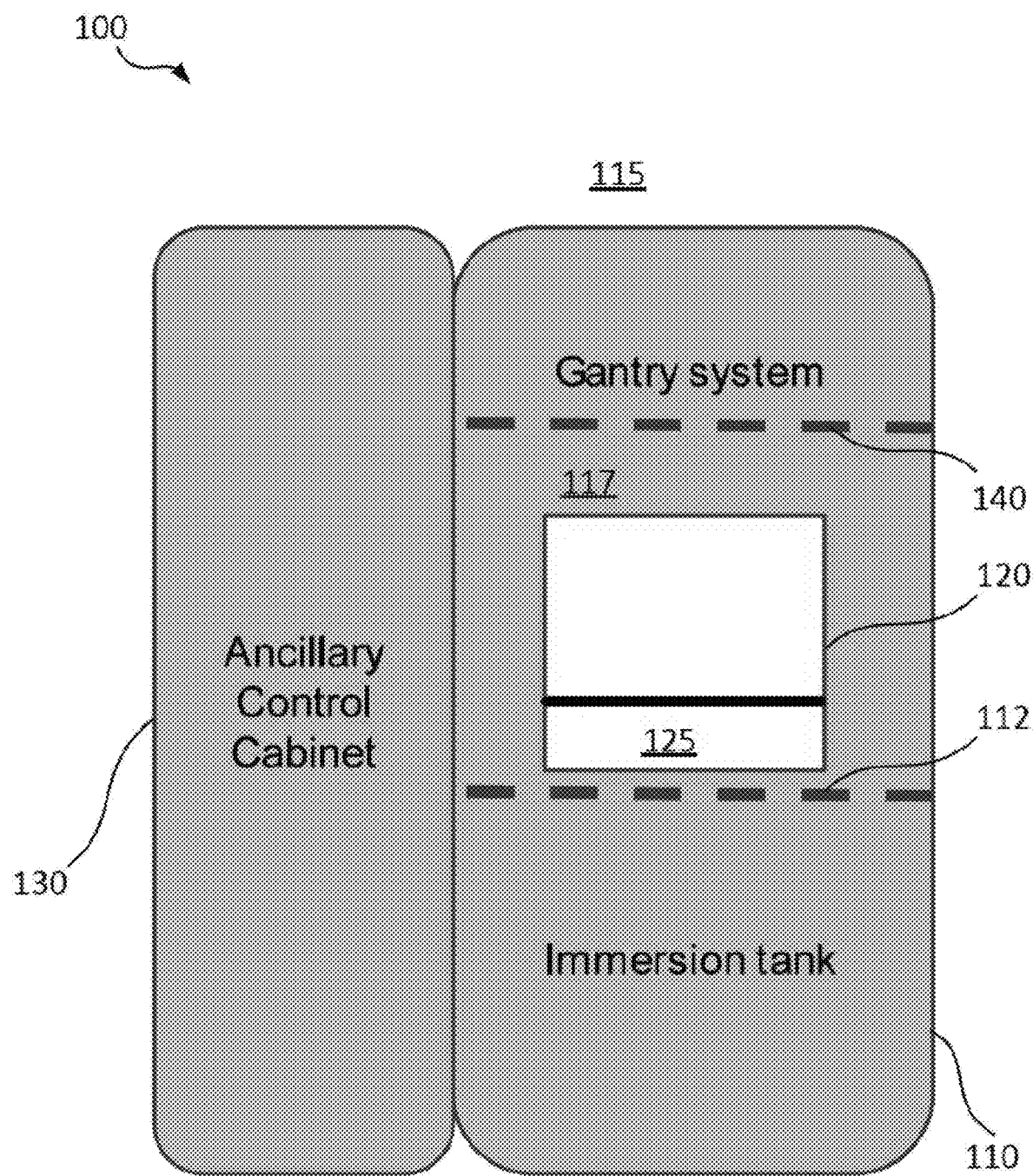
FIG. 1 is a front elevation view of a schematic representation of an immersion cooling unit with a fluid recovery system.

FIG. 1A illustrates an immersion cooling unit 100. Immersion cooling unit 100 includes a housing 110 and, in the illustrated example, an ancillary control cabinet 130 for housing controllers, user interface devices, and any pumps, tubing, or other hardware associated with immersion cooling unit 100 that need not be contained within housing 110 or that would be advantageous to be kept readily accessible from outside immersion cooling unit 100. These possible contents of ancillary control cabinet 130 could be built into housing 110 or stored another way, so ancillary control cabinet 130 is optional.

Housing 110 partitions an internal space 117 enclosed by housing 110 from an external space 115 outside of housing 110. Housing 110 encloses an immersion tank 112, which may be filled with dielectric fluid, and a crane system 140 above the tank 112. Tank 112 and crane system 140 are therefore both in internal space 117. A transfer chamber 120 extends through a wall of housing 110, and is exposed to both internal space 117 and external space 115. In the illustrated example, a collector 125 is provided at a bottom of transfer chamber 120 for collecting dielectric fluid shed from hardware exiting housing 110 through transfer chamber 120, though in other examples collector 125 may be located elsewhere in transfer chamber 120 or absent entirely. Collector 125 may be, for example, a tray, a drain that may lead back to tank 112, a condenser, an absorbent material, any other device or element suitable for recovering dielectric fluid, or any combination of the foregoing.

Figure 2:
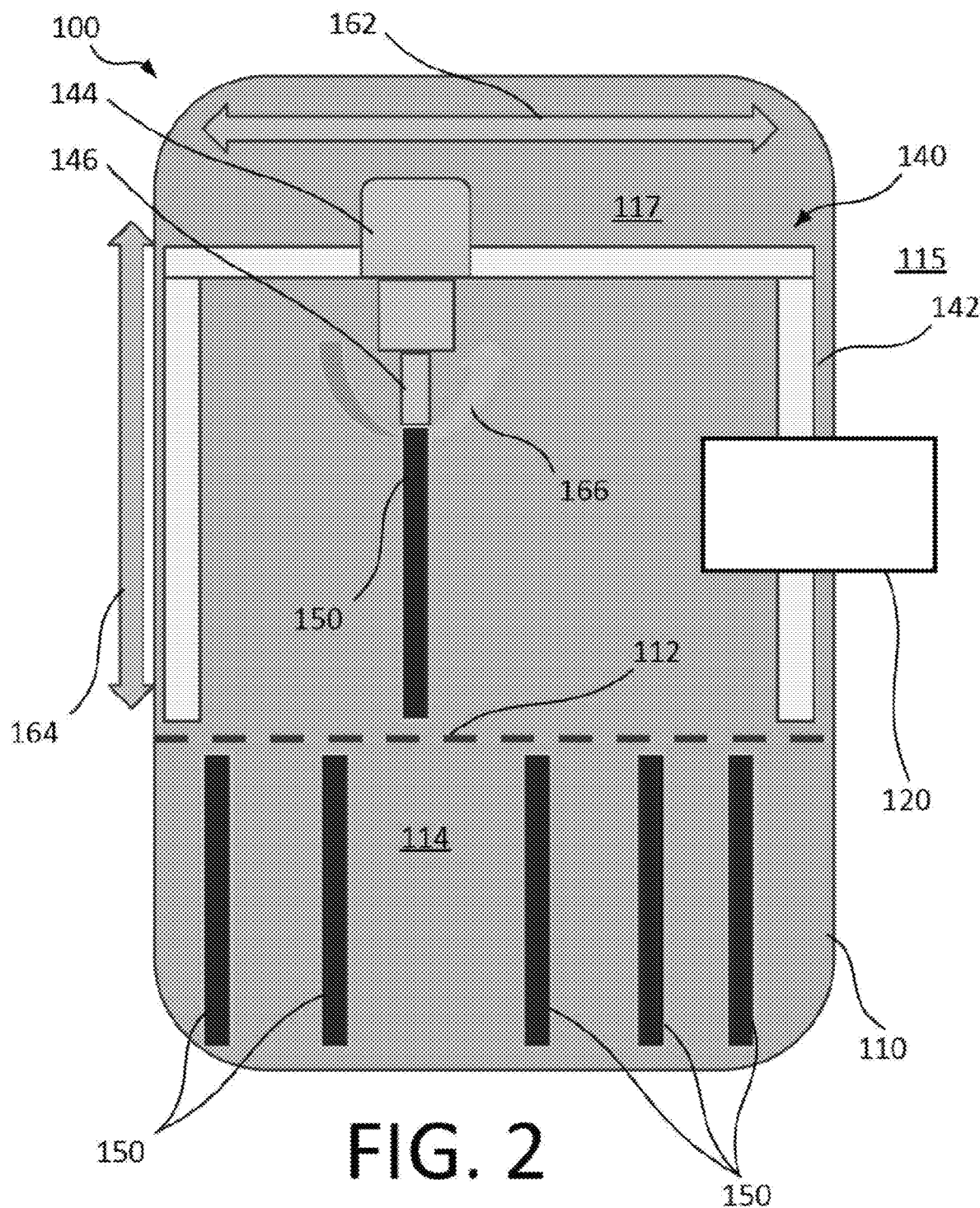
FIG. 2 is a partially cut away front elevation view of the immersion cooling unit of FIG. 1.

FIG. 2 shows the contents of housing 110 in greater detail. Tank 112 contains dielectric fluid 114 in which information technology ("IT") or other hardware components 150 are immersed. Crane system 140 includes a gantry 142 extending horizontally within housing 110 across an area above tank 112 and an arm 144 supported by gantry 142.

Arm 144 can travel horizontally along gantry along at least one axis, though in the illustrated example arm 144 is capable of horizontal travel 162 along gantry 142 in two dimensions. Arm 144 is also extendable to enable vertical movement 164 of a grip 146 at a distal end of arm 144. Extension of arm 144 may be enabled by any known mechanisms, such as, for example, a telescopic structure enabling arm 144 to collapse and expand, a series of pivot joints enabling arm 144 to fold and unfold, a chain or cable that may be wound and unwound, or any other extendable structure. Grip 146 is any device capable of engaging and releasing components 150, such as, for example, a movable claw, hook, jaw, or clamp, a magnet, a suction cup, or any other suitable mechanism.

A range of vertical movement 164 extends low enough that grip 146 may engage components 150 that are immersed in dielectric fluid in their intended operating position. The range of vertical movement 164 also extends high enough that arm 144 and grip 146 can hold a component 150 above the surface of dielectric fluid 114 and the tops of any other components 150 and place the held component 150 in transfer chamber 120. A range of horizontal movement 162 extends across some or all of the intended positions for components 150 in the tank 112 and either into transfer chamber 120 or near enough to transfer chamber 120 so that arm 144 can deposit a component 150 into transfer chamber 120 or retrieve a component from transfer chamber 120. In examples wherein the range of horizontal movement 162 does not extend into transfer chamber 120, arm 144 may be able to bend, articulate, swing, or otherwise reach toward or into transfer chamber 120 to deposit a component 150 into transfer chamber 120 or retrieve a component 150 from transfer chamber 120. Crane system 140 can therefore use arm 144 and grip 146 to lift a component 150 from the component's 150 operating position immersed dielectric fluid 114 in tank 112 to an elevation above the surface of dielectric fluid 114 and other components 150, carry the lifted component 150 to transfer chamber 120, and then deposit the lifted component 150 in transfer chamber 120. Similarly, crane system 140 can use arm 144 and grip 146 to take a component 150 from transfer chamber 120 and then deposit the component 150 in an intended operating position for the component 150 in tank 112. Each reference to a component 150 can be understood to refer to only a single component or multiple components that may be grouped together or connected to one another unless stated otherwise.

In yet other examples wherein the range of horizontal movement 162, transfer chamber 120 may be provided with a mechanism for moving component 150, such as conveyor 128 which will be described below with regard to FIG. 3, and that mechanism may extend out of transfer chamber 120 and into a portion of internal space 117 that is accessible by conveyor system 140. In such examples, crane system 140 may deposit component 150 to the conveyor 128 or other mechanism and crane system 140 may lift a component from conveyor 128 or other mechanism, and conveyor 128 may bring a deposited component 150 out of transfer chamber 120 into internal space 117 and out of internal space 117 into transfer chamber 120.

Dielectric fluid 114 can be conserved by allowing components 150 to drip dry after being lifted out of tank 112 and before being taken out of unit 100. For example, arm 144 may pause after lifting a component 150 out of tank 112 and before depositing the component 150 in transfer chamber 120. In addition or in the alternative, component 150 may be allowed to rest after being placed in transfer chamber 120 so that collector 125 may collect dielectric fluid that drips off of component 150.

In some examples, arm 144 may be capable of rotating grip 146 about a vertical, or at least approximately vertical, axis. Such rotation 166 of grip 146 may be employed when grip 146 holds a component 150 above tank 112 to spin dry the held component 150, thereby recovering dielectric fluid 114 from the surface of component 150. Arm 144 or gantry 142 may be provided with a motor to enable rotation 166. In other examples, the grip holds component 150 in the transfer chamber 120 to spin dry the held component, thereby recovering dielectric fluid 114 from the surface of component 150.

Many known dielectric fluids are resistant to wetting to common materials from which the exterior surfaces of IT and computer hardware are commonly formed, meaning that in many applications the dielectric fluid will form in easily shed beads upon the surface of components 150 lifted out of tank 112. The above described drip drying and spin drying processes can therefore be expected to remove all, or at least a majority, of dielectric fluid from components 150 in an acceptable amount of time in most cases.

Figure 3:
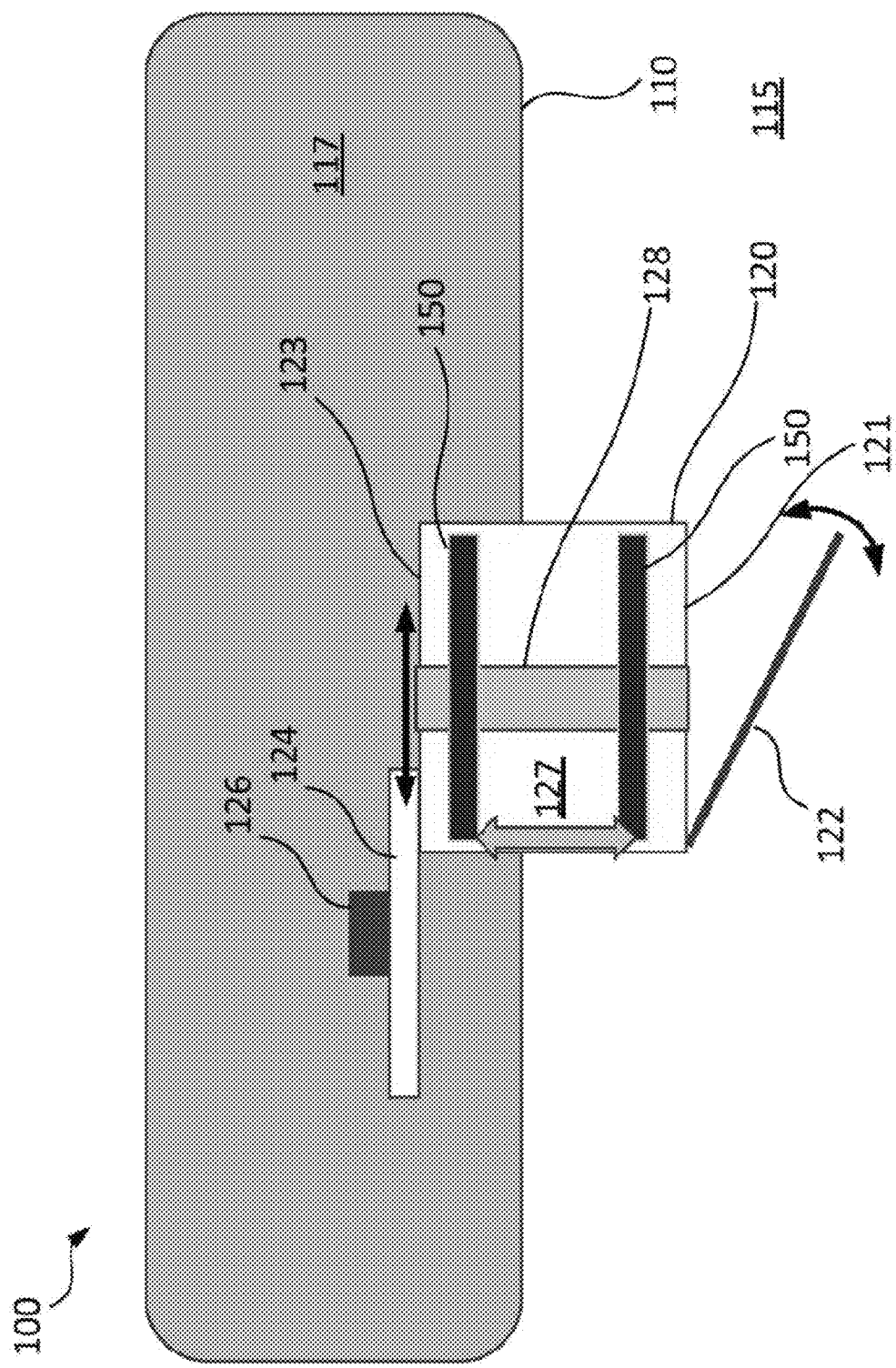
FIG. 3 is a partially cut away top plan view of the immersion cooling unit of FIG. 1.

As shown in FIG. 3, transfer chamber 120 has an outer opening 121 and an inner opening 123. Outer opening 121 is between a transfer space 127 enclosed by the transfer chamber 120 and a space outside of the housing 110, while inner opening 123 is between the transfer space 127 and the interior of unit 100 enclosed by housing 110. As such, while housing 110 therefore acts as a partition between internal space 117 enclosed by housing 110 and external space 115 outside of housing 110, passage between external space 115 and internal space 117 is possible through the transfer chamber 120. Specifically, fluid communication and transfer of solid objects such as components 150 between external space 115 and transfer space 127 is possible through outer opening 121, and fluid communication and transfer of solid objects such as components 150 between internal space 117 and transfer space 127 is possible through inner opening 123.

Transfer chamber 120 also includes an outer door 122 and an inner door 124. Outer door 122 is selectively movable between an open position, wherein passage of components 150 or other objects between external space 115 and transfer space 127 through outer opening 121 is possible, and a closed position, wherein outer door 122 seals outer opening 121 shut and prevents passage of components 150 or vapor through outer opening 121. Similarly, inner door 124 is selectively movable between an open position, wherein passage of components 150 or other objects between internal space 117 and transfer space 127 through inner opening 123 is possible, and a closed position, wherein inner door 124 seals inner opening 123 shut and prevents passage of components 150 or vapor through inner opening 123. Opening and closing of outer door 122 and inner door 124 results in the opening and closing of outer opening 121 and inner opening 123, respectively. As such, reference to outer door 122 being open or closed also means that outer opening 121 is open or closed, respectively, and reference to inner door 124 being open or closed means that inner opening 121 is open or closed, respectively. In the illustrated example, outer door 122 pivots on a hinge about a vertical axis between its open and closed positions, while inner door 124 slides along a track or rail to translate horizontally between its open and closed positions. However, in other examples, either or both of the doors 122, 124, in any combination, may transition between their respective open and closed positions by translating or rotating relative to any axis. Either or both of the doors 122, 124 may be fitted with a seal to prevent air from escaping around the edges of the door 122, 124 when the door 122, 124 is closed.

Outer door 122 and inner door 124 may be manually controllable, automated by a controller, or both. Regardless, outer door 122 and inner door 124 may be operated or controlled so that both doors 122, 124 are never open at the same time, at least during normal operation of unit 100. By keeping at least one door 122, 124 closed at all times, internal space 117 may be prevented from coming into fluid communication with external space 115, thereby reducing or preventing escape of heat and dielectric fluid vapor from internal space 117 through transfer chamber 120. It is therefore possible to pass a component 150 into housing 110 without a need to pause operation of unit 100 or the components 150 operating therein by placing a component 150 into transfer space 127 through outer opening 121 while outer door 122 is open and inner door 124 is closed, followed by closing outer door 122, then opening inner door 124 so that crane system 140 can retrieve the component 150 from transfer space 127 through inner opening 123. Similarly, it is possible to pass a component 150 out of housing 110 without a need to pause operation of unit 100 or the other components 150 operating therein by using crane system 140 to place a component 150 into transfer space 127 through inner opening 123 while inner door 124 is open and outer door 122 is closed, followed by closing inner door 124, then opening outer door 122 and retrieving the component 150 from transfer space 127 through outer opening 121.

A component 150 placed into transfer space 127 through inner opening 123 may be allowed to cool, dry, or both after inner door 124 is closed and before outer door 122 is opened. The air in transfer space 127 may be cooled, dried, or both at the same time. Drying the contents of transfer chamber 120 before opening outer door 122 enables recovery of dielectric fluid. For example, dielectric fluid may be allowed to drip off a component 150 in transfer space 127 or may be blown off a component 150 in transfer space 127 with a fan. Collector 125 may recover dielectric fluid that drips from the surface of component 150. Air in transfer space 127 can be dried by exhausting dielectric fluid vapor from transfer space 127 to internal space 117, providing a condenser in transfer space 127, or allowing dielectric fluid vapor to condense into a liquid state and be recovered by the collector 125. In the illustrated example, inner door 124 includes an exhaust fan 126 to exhaust dielectric fluid vapor from transfer space 127 to internal space 117. In other examples, exhaust fan 126 is located elsewhere in transfer chamber 120, but still directed to pull air from transfer space 127 to internal space 117. In yet further examples, instead of or in addition to exhaust fan 126, transfer chamber 120 may be provided with a fan or other forced air source configured to drive air from transfer space 127 to collector 125. In yet further examples, instead or in addition to exhaust fan 126, transfer chamber may be provided with an air pump to pull air from transfer space 127 through collector 125 or to internal space 117. Transfer chamber 120 may be provided with a source of air that has little or no dielectric fluid vapor, such as air from external space 115, to replace the vapor-containing air removed from transfer space 127 by the above described fans and air pumps. Any of the above described approaches to ventilating transfer chamber 120 will also tend to hasten the shedding of dielectric fluid from the surface of a component 150 located in transfer chamber 120.

Transfer chamber 120 may also be provided with an internal conveyor 128 to move a component 150 inward and outward within transfer space 127 between the two positions of component 150 shown in FIG. 3. As shown in FIG. 3, one position of component 150 is nearer to outer opening 121 and outer door 122, while the other position of component 150 is nearer to inner opening 123 and inner door 124. The position nearer inner opening 123 and inner door 124 may make component 150 accessible to crane system 140 or other internal mechanisms of unit 100 to enable mechanical, and in some examples automated, transport of component 150 from transfer chamber 120 to an intended operating position for component 150 in tank 112. The position nearer outer opening 121 and outer door 122 is relatively easily accessible from outside of housing 110, such as for manual access by a worker. Conveyor 128 therefore facilitates interaction between unit 100 and workers or external systems by making component 150 conveniently accessible from either end of transfer chamber 120 as needed. Conveyor 128 may optionally be used to agitate component 150 to shake dielectric fluid off of component 150. Conveyor 128 may be, for example, a conveyor belt, a platform movable by a linear actuator, a pair of opposed linear actuators arranged to push component 150 back and forth, any other mechanism suitable for moving IT and computer hardware within transfer chamber 120, or any combination of the foregoing. The need for conveyor 128 depends on the size and proportions of transfer chamber 120, which can vary between implementations, so in some examples other than the illustrated example, transfer chamber 120 is not provided with a conveyor 128.

Figure 4A:
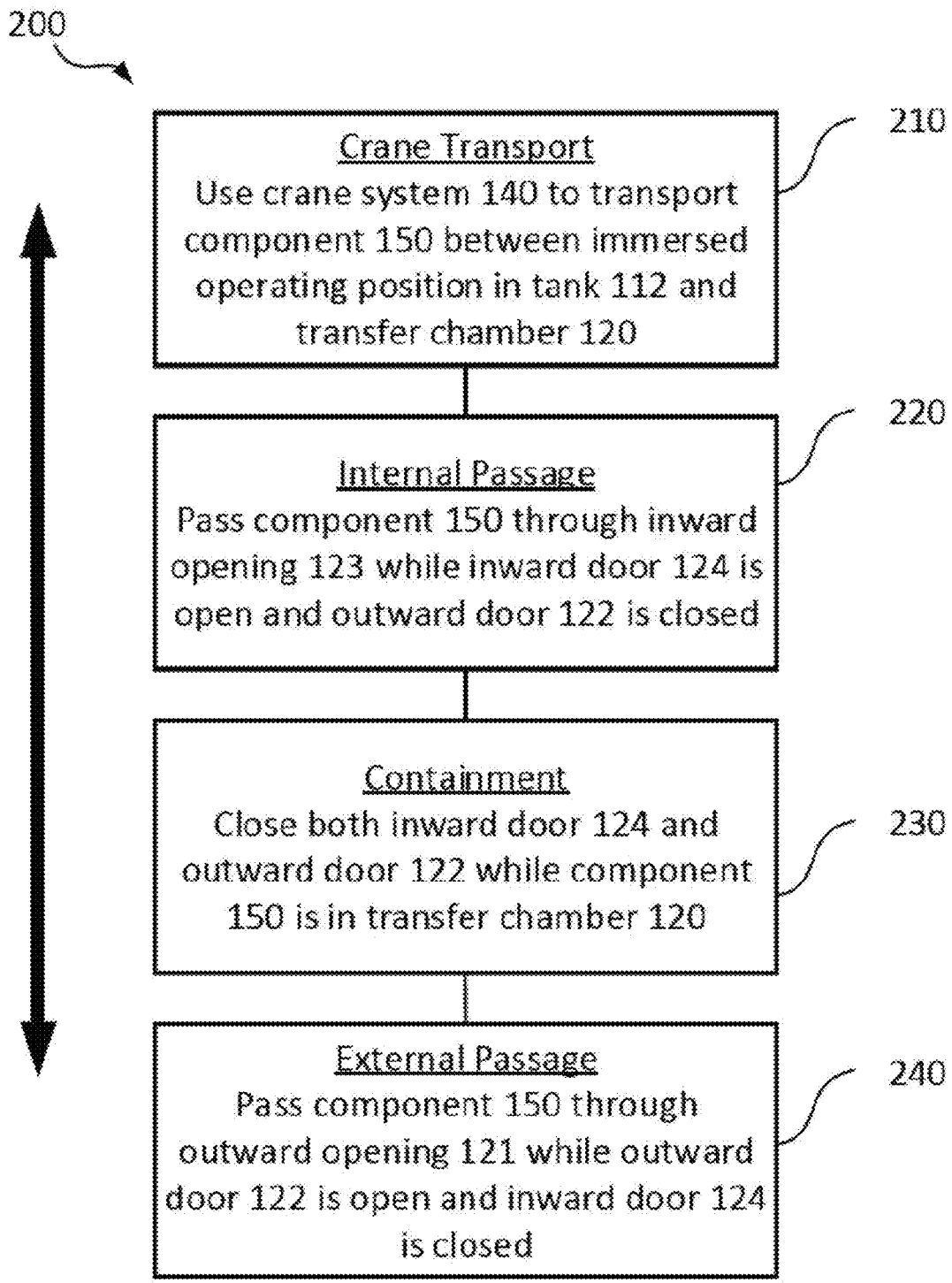
FIG. 4A is a flowchart of a process for using the immersion cooling unit of FIG. 1.

FIG. 4A illustrates a process 200 of operating the unit 100. The process 200 is described in relation to the elements of FIGS. 1-3 described above, but it should be understood that the process may be performed in connection with other implementations.

In process 200, crane transport 210 includes using crane system 140 to transport a component 150 between an operating position in tank 112, at which the component 150 may operate while immersed in dielectric fluid 114 and cooled by unit 100, and transfer chamber 120. The transport between tank 112 and transfer chamber 120 may be in either direction. That is, crane transport 210 here refers to crane system 140 either transporting component 150 from tank 112 to transfer chamber 120 or from transfer chamber 120 to tank 112. In instances of crane transport 210 from tank 112 to transfer chamber 120, crane transport 210 may optionally include either or both of pausing while crane system 140 suspends component 150 above tank 112 and using crane system 140 to agitate component 150, such as by shaking or spinning component 150. These optional pausing and agitating processes facilitate removal of dielectric fluid from component 150 before component 150 enters transfer chamber 120. Neither door 122, 124 needs to be open during crane transport 210.

Process 200 also includes internal passage 220, wherein the component 150 transported during crane transport 210 passes through inner opening 123 of transfer chamber 120 while inner door 124 is open and outer door 122 is closed. Internal passage 220 may be in either direction, meaning internal passage may be either passage of component 150 from transfer space 127 to internal space 117, in which case internal passage 220 would be followed by crane transport 210 and preceded by containment 230, or passage of component 150 from internal space 117 to transfer space 127, in which case internal passage 220 would be preceded by crane transport 210 and followed by containment 230.

Containment 230 is a portion of process 200 wherein component 150 is enclosed by transfer chamber 120, and therefore located in transfer space 127, and outer door 122 and inner door 124 are both closed. Containment 230 may be either preceded by both crane transport 210 and internal passage 220, in that order, and followed by external passage 240, or preceded by external passage 240 and followed by internal passage 220 and crane transport 210, in that order. Where containment 230 follows external passage 240, containment 230 may optionally include use of conveyor 128 to move component 150 inward toward internal space 117 if necessary. Where containment 230 follows crane transport 210 and internal passage 220, containment may optionally include either or both of using conveyor 128 to move component 150 outward toward external space 115 and dielectric fluid recovery processes. The dielectric fluid recovery processes can include any one or any combination of the measures for recovering dielectric fluid from component 150 and internal space 127 when component 150 is in internal space 127 described above, including pausing to let component 150 drip dry, using conveyor 128 to agitate component 150, and ventilating internal space 127 with exhaust fan 126 or other air movement devices.

Process 200 also includes external passage 240, wherein component 150 passes through outer opening 121 of transfer chamber 120 while outer door 122 is open and inner door 124 is closed. External passage 240 may be done manually by a worker or mechanically with systems external to unit 100, such as robots working in a data center wherein unit 100 is installed. External passage 240 can be in either direction, meaning external passage 240 can be either passage of component 150 from transfer space 127 to external space 115, in which case external passage 240 would be preceded by crane transport 210, internal passage 220, and containment 230, in that order, or passage of component 150 from external space 115 to transfer space 127, in which case external passage 240 would be followed by containment 230, internal passage 220, and crane transport 210, in that order. Process 200 as represented in FIG. 4A is therefore fully reversible. That is, process 200 can be performed as first completing crane transport 210, then internal passage 220, then containment 230, then external passage 240 or as first completing external passage 240, then containment 230, then internal passage 220, then crane transport 210. Process 200 can be repeated in either direction as necessary to add or remove components 150 from unit 100.

In either order of process 200, containment 230 requires both doors 122, 124 to be closed between internal passage 210, wherein outer door 122 must be closed, and external passage 240, wherein inner door 124 must be closed. As such, in either direction, process 200 causes a component 150 to pass between external space 115 and internal space 117 without external space 115 and internal space 117 ever being in fluid communication with one another. Process 200 therefore enables components 150 to pass into and out of unit 100 with little or no escape of dielectric fluid vapor from internal space 117 and without exposing external space 115 to much of the heat generated by components 150 operating in tank 112. As such, process 200 can reduce downtime for unit 100 and the components 150 operating therein by avoiding the need to shut off unit 100 or the components 150 operating therein when hardware is to be added to or removed from unit 100.

Figure 4B:
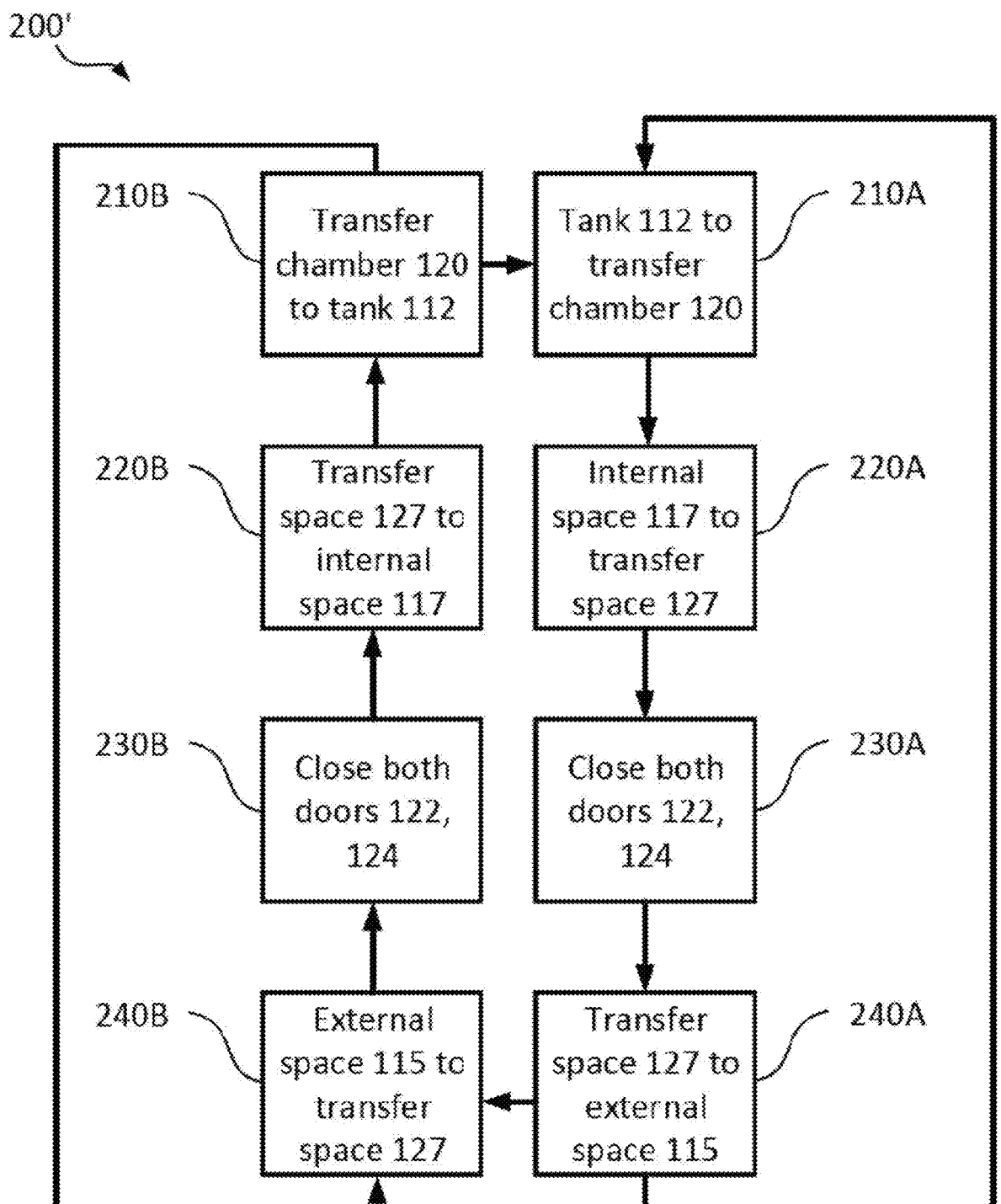
FIG. 4B is a flowchart of another process for using the immersion cooling unit of FIG. 1.

FIG. 4B shows process 200' as another example representation of process 200. As such, in process 200', numbered features correspond to like numbered features of process 200 as represented in FIG. 4A, and the process is described below in relation to the elements of FIGS. 1-3. Process 200' includes an outward sequence 210A, 220A, 230A, 240A for removing components 150 from unit 100 and an inward sequence 240B, 230B, 220B, 210B for adding components 150 to unit 100.

In inward external passage 240B, a component 150 passes from external space 115 to transfer space 120 through outer opening 121 while inner door 124 remains closed. In inward internal passage 220B, the component 150 passes from transfer space 127 to internal space 117 through inner opening 123 while outer door 122 remains closed. In inward crane transport 210B, crane system 140 retrieves the component 150 from transfer chamber 120 and places the component 150 in its intended operating position in tank 112. In outward crane transfer 210A, crane system 140 lifts a component 150 from the component's 150 operating position in tank 112 and transports the component 150 to transfer chamber 120. In outward internal passage 220A, the component 150 passes from internal space 117 to transfer space 127 through inner opening 123 while outer door 122 remains closed. In outward external passage 240A, the component 150 passes from transfer space 127 to external space 115 through outer opening 121 while inner door 124 remains closed. During both outward containment 230A and inward containment 230B, outer door 124 and inner door 122 are both closed, though conveyor 128 may optionally move component outward during outward containment 230A and inward during inward containment 230B. Either or both of outward crane transport 210A and outward containment 230A may include the processes for recovering dielectric fluid from the surface of a component 150 or from vapor in internal space 127 as described above with respect to crane transport 210 and containment 230 in process 200 of FIG. 4A.

Upon completing outward sequence 210A, 220A, 230A, 240A, one can either repeat outward sequence 210A, 220A, 230A, 240A or move to inward sequence 240B, 230B, 220B, 210B. Similarly, upon completing inward sequence 240B, 230B, 220B, 210B, one can either repeat inward sequence 240B, 230B, 220B, 210B or move to outward sequence 210A, 220A, 230A, 240A. Components 150 may therefore be added to unit 100 and removed from unit 100 as necessary by following process 200' without the need to shut off unit 100 or the components 150 operating therein.

Figure 5A:
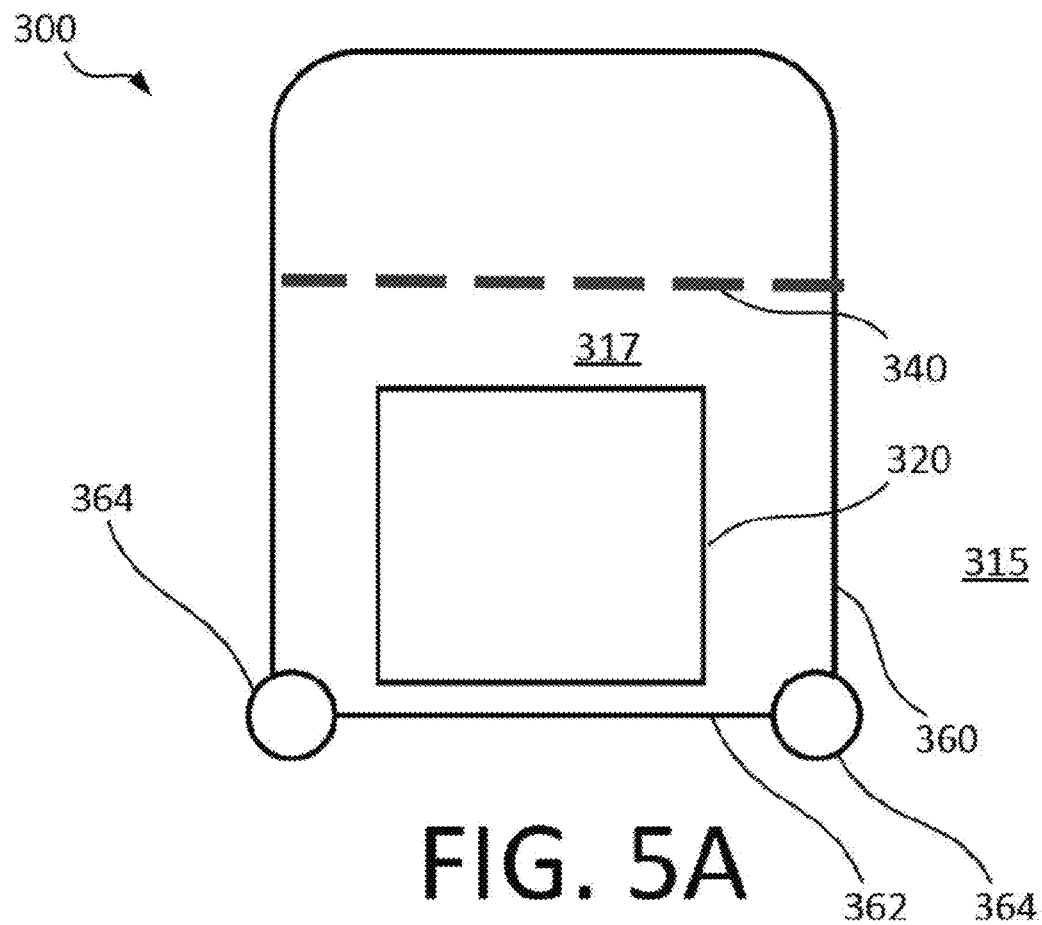
FIG. 5A is a front elevation view of a schematic representation of a fluid recovery module.

FIG. 5A shows a transfer module 300 according to another example. Transfer module 300 includes a transfer chamber 320 and a crane system 340 that are generally alike to the transfer chamber 120 and crane system 140, respectively, as described above with regard to all features and possible variations. However, transfer module 300 includes a wall or partition 360, relative to which are defined an outer space 315 and an inner space 317. Crane system 340 is located in inner space 317, and transfer chamber 320 extends through partition 360 to enable transfer of components 150 between outer space 315 and inner space 317 in the same way that components could be transferred between external space 115 and internal space 117 through transfer chamber 120. Partition 360 defines an aperture 362 that opens into inner space 317, so partition 360 on its own does not entirely enclose inner space 317. However, a door or lid, not shown, may be provided to close off aperture 362 and enclose inner space 317 in some examples.

Transfer module 300 is movable. In the illustrated example, transfer module 300 includes wheels 364, and transfer module 300 can be moved by rolling on wheels 364. However, in other examples, transfer module 300 could lack wheels 364 and be movable by other features, such as by treads, a conveyor belt, or any other suitable mechanism. Transfer module 300 may be placed on a rail 465 to guide movement of transfer module 300 as shown in FIG. 5B, though in other examples rail 465 may be omitted.

Figure 5B:
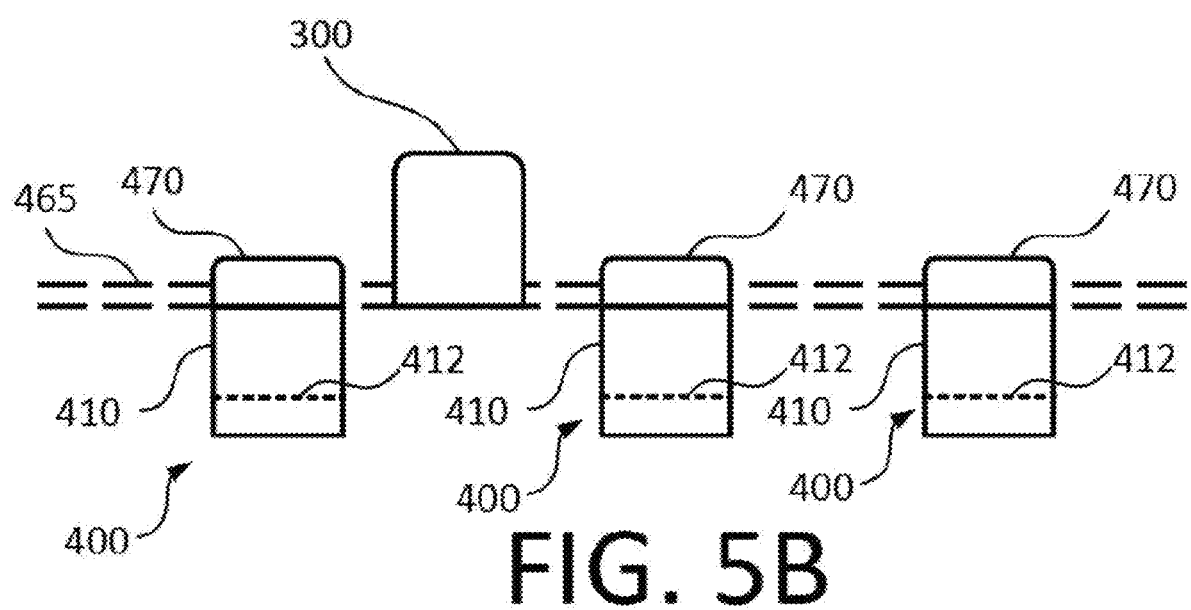
FIG. 5B is a schematic representation of an array of immersion cooling units within which the fluid recovery module of FIG. 5A is installed.

As shown in FIG. 5B, transfer module 300 is movable between immersion cooling units 400. Each immersion cooling unit 400 includes a housing 410 that contains a tank 412 of dielectric fluid for cooling components 150 as they operate. Each immersion cooling unit 400 also includes a lid 470 that can be opened or removed to provide an opening to which aperture 362 can be sealed. Each unit 400 can therefore operate without transfer module 300 with lid 470 closed, and a lid 470 can be opened or moved to enable attachment of transfer module 300 to the corresponding unit 400 when transfer of components into or out of that unit 300 becomes necessary. Lids 470 may optionally be constructed to be able to open and close after transfer module 300 is already sealed to the corresponding unit so that transfer module 300 can be attached to a unit 400 or removed from a unit 400 without pausing operation of that unit 400 or allowing vapor to escape the unit 400. For example, each lid 470 may include a motorized element that can selectively open or close a window into housing 410, and aperture 362 may be shaped to seal around the window. Regardless, attachment of transfer module 300 to a unit 400 enables transfer of components 150 into and out of unit 300 in a manner generally alike to processes 200, 200'.

Units 400 may be newly constructed immersion cooling units designed specifically to cooperate with transfer module 300. In other examples, some or all units 400 may be conventional immersion cooling units. In further examples, units 400 may be mostly conventional immersion cooling units that were retrofitted for use with transfer module 300 by the addition of lid 470. The capacity of transfer module 300 to be designed to fit existing openings of conventional immersion cooling units or to cooperate with lids 470 that can be installed on otherwise conventional immersion cooling units enables data centers or other facilities with preexisting immersion cooling units 400 to be easily adapted for use with transfer processes 200, 200'. That is, several preexisting immersion cooling units 400 can be made usable for use with a single transfer module 300 so that transfer processes 200, 200' can be implemented without replacing the units 300 with units 100 adding crane systems 140 and transfer chambers 120 to each unit 300.

Although the concepts herein have been described with reference to particular examples, it is to be understood that these examples are merely illustrative of the principles and applications of the present concept. It is therefore to be understood that numerous modifications may be made to the illustrative examples and that other arrangements may be devised without departing from the spirit and scope of the present concept as defined by the appended claims.

The invention claimed is:

1. A fluid recovery system for an immersion cooling unit, the system comprising: a transfer chamber enclosing a transfer space and including a first opening into the transfer space, a second opening into the transfer space, a first door operable to selectively open or close the first opening, and a second door operable to selectively open or close the second opening; a gantry; and an arm supported by the gantry and movable by the gantry through the first opening, wherein the first door includes an exhaust opening and an exhaust fan arranged to draw air out of the transfer chamber through the exhaust opening when the first door is closed.

2. The system of claim 1, wherein the doors are configured to be opened and closed independently from one another.

3. The system of claim 1, further comprising a conveyor within the transfer chamber configured to transport computer hardware between at least two different locations within the transfer chamber.

4. The system of claim 3, wherein the conveyor is any one or any combination of a conveyor belt, a platform connected to a linear actuator, and an arrangement of multiple linear actuators.

5. The system of claim 1, further comprising a fan or air pump configured to displace air from the transfer chamber when both doors are closed.

6. The system of claim 5, further comprising a condenser, and wherein the fan or the air pump is configured to direct the displaced air through the condenser.

7. The system of claim 1, further comprising a motor configured to spin the arm.

8. The system of claim 1, comprising a partition separating a first space from a second space, wherein the gantry is located in the first space, the first opening is between the first space and the transfer space, and the second opening is between the second space and the transfer space.

9. The immersion cooling unit for computer hardware comprising an enclosure and the fluid recovery system of claim 8, wherein the partition of the fluid recovery system is part of the enclosure.

10. A fluid recovery module including the fluid recovery system of claim 8, wherein the partition is configured to hermetically seal an internal space of a separate immersion cooling unit.

11. The module of claim 10, comprising a set of wheels mounted to the partition.

12. An immersion cooling array, comprising:
a plurality of immersion cooling units each of which includes a tank for storing dielectric liquid;
the immersion cooling module of claim 10; and
a rail for conveying the immersion cooling module among the immersion cooling units.

13. A method of conveying a computer hardware component into or out of an immersion cooling unit, the method comprising: passing the component through a first opening of a transfer chamber while a second opening of the transfer chamber is closed; passing the component through the second opening while the first opening is closed, and displacing air from the transfer space while both openings are closed and the component is in the transfer chamber; wherein: the first opening is between a transfer space enclosed by the transfer chamber and an internal space enclosed by the immersion cooling unit and within which a cooling tank is located; and the second opening is between the transfer space and an ambient space outside of the immersion cooling unit.

14. The method of claim 13, wherein passing the component through the first opening is accomplished with a mechanical arm that is movably connected to a gantry located within the internal space.

15. The method of claim 14, comprising carrying the component between the first opening and an operating position in the tank with the mechanical arm and the gantry.

16. The method of claim 15, comprising spinning the component with the mechanical arm after lifting the component out of the operating position and a liquid in the tank.

17. The method of claim 15, comprising continuing to run the immersion cooling unit and other computer hardware cooled in the tank throughout passing the component through the first and second openings and carrying the component between the first opening and the operating position.

18. The method of claim 13, comprising moving the component between two positions within the transfer space with a mechanical conveyor.

* * * * *